(12) United States Patent
Hsin et al.

(10) Patent No.: US 7,759,172 B2
(45) Date of Patent: Jul. 20, 2010

(54) METHOD OF FORMING A PLANAR COMBINED STRUCTURE OF A BIPOLAR JUNCTION TRANSISTOR AND N-TYPE AND P-TYPE METAL SEMICONDUCTOR FIELD-EFFECT TRANSISTORS AND METHOD FOR FORMING THE SAME

(75) Inventors: Yue-Ming Hsin, Tainan (TW); Jinn-Kong Sheu, Jiangjyun Township (TW); Kuang-Po Hsueh, Taipei (TW)

(73) Assignee: National Central University, Taoyuan County (TW)

( * ) Notice: Subject to any disclaimer, the term of this patent is extended or adjusted under 35 U.S.C. 154(b) by 0 days.

(21) Appl. No.: 12/190,117

(22) Filed: Aug. 12, 2008

(65) Prior Publication Data

US 2008/0299714 A1 Dec. 4, 2008

Related U.S. Application Data

(62) Division of application No. 11/708,515, filed on Feb. 20, 2007, now abandoned.

(51) Int. Cl.
*H01L 21/8248* (2006.01)
*H01L 29/812* (2006.01)
(52) U.S. Cl. .................... 438/137; 438/147; 257/370; 257/471; 257/E27.017

(58) Field of Classification Search ................ 438/137, 438/147; 257/370, 471, 477, E27.015, E27.017
See application file for complete search history.

(56) References Cited

U.S. PATENT DOCUMENTS

2006/0113593 A1* 6/2006 Sankin et al. ............... 257/341

* cited by examiner

*Primary Examiner*—Lynne A Gurley
*Assistant Examiner*—Vernon P Webb (57) ABSTRACT

A planar combined structure of a bipolar junction transistor (BJT) and n-type/p-type metal semiconductor field-effect transistors (MESFETs) and a method for forming the structure. The n-type GaN MESFET is formed at the same time when an inversion region (an emitter region) of the GaN BJT is formed by an ion implantation or impurity diffusion method by using a particular mask design, while a p-type GaN region is at the same time is formed as the p-type GaN MESFET. Namely, the n-type channel of the n-type MESFET is formed by the ion implantation or impurity diffusion method when the BJT is formed with the same ion implantation or impurity diffusion method performed, while a region of the p-type GaN without being subject to the ion implantation or impurity diffusion method is formed as the p-type MESFET. As such, the BJT is formed currently with the n-type/p-type MESFETs on the same GaN crystal growth layer as a planar structure.

2 Claims, 11 Drawing Sheets

METHOD OF FORMING A PLANAR COMBINED STRUCTURE OF A BIPOLAR JUNCTION TRANSISTOR AND N-TYPE AND P-TYPE METAL SEMICONDUCTOR FIELD-EFFECT TRANSISTORS AND METHOD FOR FORMING THE SAME

CROSS-REFERENCE TO RELATED APPLICATIONS

The present application is a division of U.S. patent application Ser. No. 11/708,515, filed on Feb. 20, 2007, titled Planar Combined Structure of a Bipolar Junction Transistor and N-type/P-type Metal Semiconductor Field-Effect Transistors and Method for Forming the Same, listing Yue-Ming Hsin, Jinn-Kong Sheu and Kuang-Po Hsueh as inventors.

BACKGROUND OF THE INVENTION

1. Field of Invention

The present invention relates to a technology of forming a bipolar junction transistor (BJT) and n-type and p-type metal-semiconductor field effect transistors (MESFETs) concurrently as a planar structure on the same gallium nitride (GaN) crystal growth layer.

2. Related Art

Figure 1:
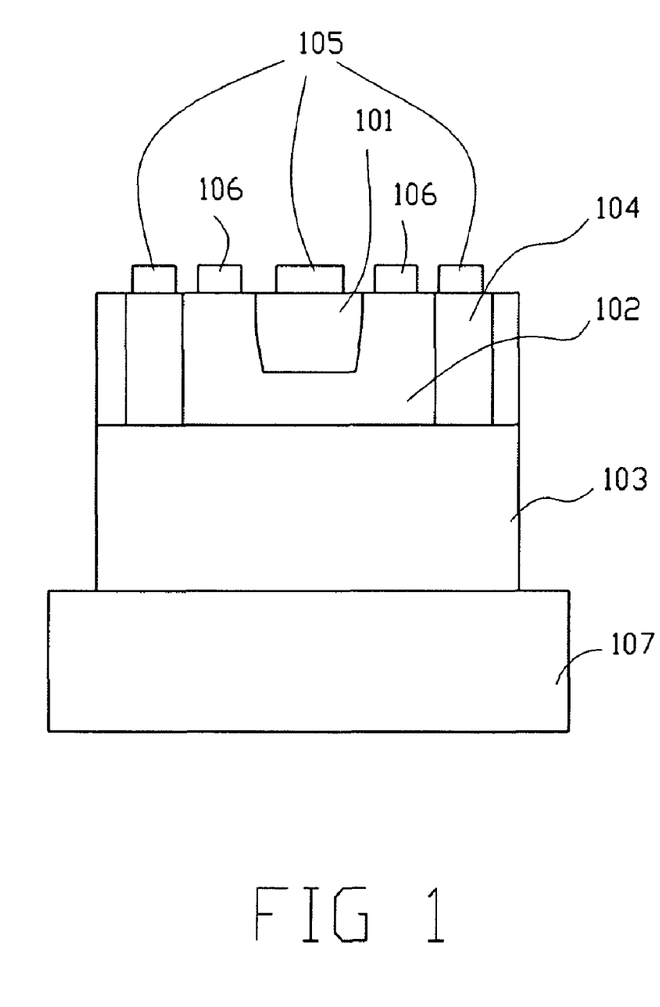
FIG. 1 is a cross sectional view of a conventional gallium nitride (GaN) bipolar junction transistor (BJT)

As shown in FIG. 1, a conventional planar structured gallium nitride (GaN) bipolar junction transistor (BJT) comprises a semi-insulating substrate for crystal growth 107, a collector layer 103, a base layer 102, a collector metal electrode 105, a base metal electrode 106, a GaN emitter region 101 and a collector contact well region 104 of an n-type GaN inverted from a p-type GaN formed by ion implantation or impurity diffusion technology. Generally, the provision of the planar structure of the GaN BJT has the advantage that another device may be fabricated and thus combined with the GaN BJT on the same horizontal base. Meanwhile, the GaN material can be prevented from a high contact resistance of the base metal after a dry etching process is applied thereto.

SUMMARY OF THE INVENTION

In view of the disadvantages discussed above with respect to the conventional planar combined structure of the gallium nitride (GaN) bipolar junction transistor (BJT) and the n-type and p-type metal-semiconductor field effect transistors (MESFETs), where the BJT and n-type and p-type MESFETs are separately formed by using different processes, the present invention discloses a new planar combined structure of the BJT and n-type and p-type MESFETs and a method for forming such planar combined structure.

In accordance with the present invention, in the planar combined structure, the n-type GaN MESFET is formed at the same time when the GaN BJT is formed by an ion implantation or impurity diffusion method by using a particular mask design. By means of the mask design, it is possible to implant ions or diffuse impurity into a channel region of the n-type MESFET at the same time when ions are implanted or diffused with respect to an n-type inversion region of the GaN BJT, so that a p-type GaN inversion region of the MESFET is inverted into an n-type channel of the n-type MESFET. Namely, the n-type channel of the n-type MESFET is formed by the ion implantation or impurity diffusion method when the BJT is formed with the same ion implantation or impurity diffusion method performed, while a region of the p-type GaN without being subject to the ion implantation or impurity diffusion method is formed as the p-type MESFET. As such, the BJT is formed currently with the n-type and p-type MESFETs on the same GaN crystal growth layer as a planar structure. With this process performed, efficiency and cost for fabrication of the planar combined structure can be enhanced and lowered, respectively, which makes a significant improvement, compared with the prior art.

BRIEF DESCRIPTION OF THE DRAWINGS

FIG. 3A through 3H are cross sectional views of the planar combined structure shown in FIG. 2 formed at stages of a manufacturing process thereof for illustration of respective steps of the manufacturing process.

DETAILED DESCRIPTION OF THE INVENTION

Figure 2:
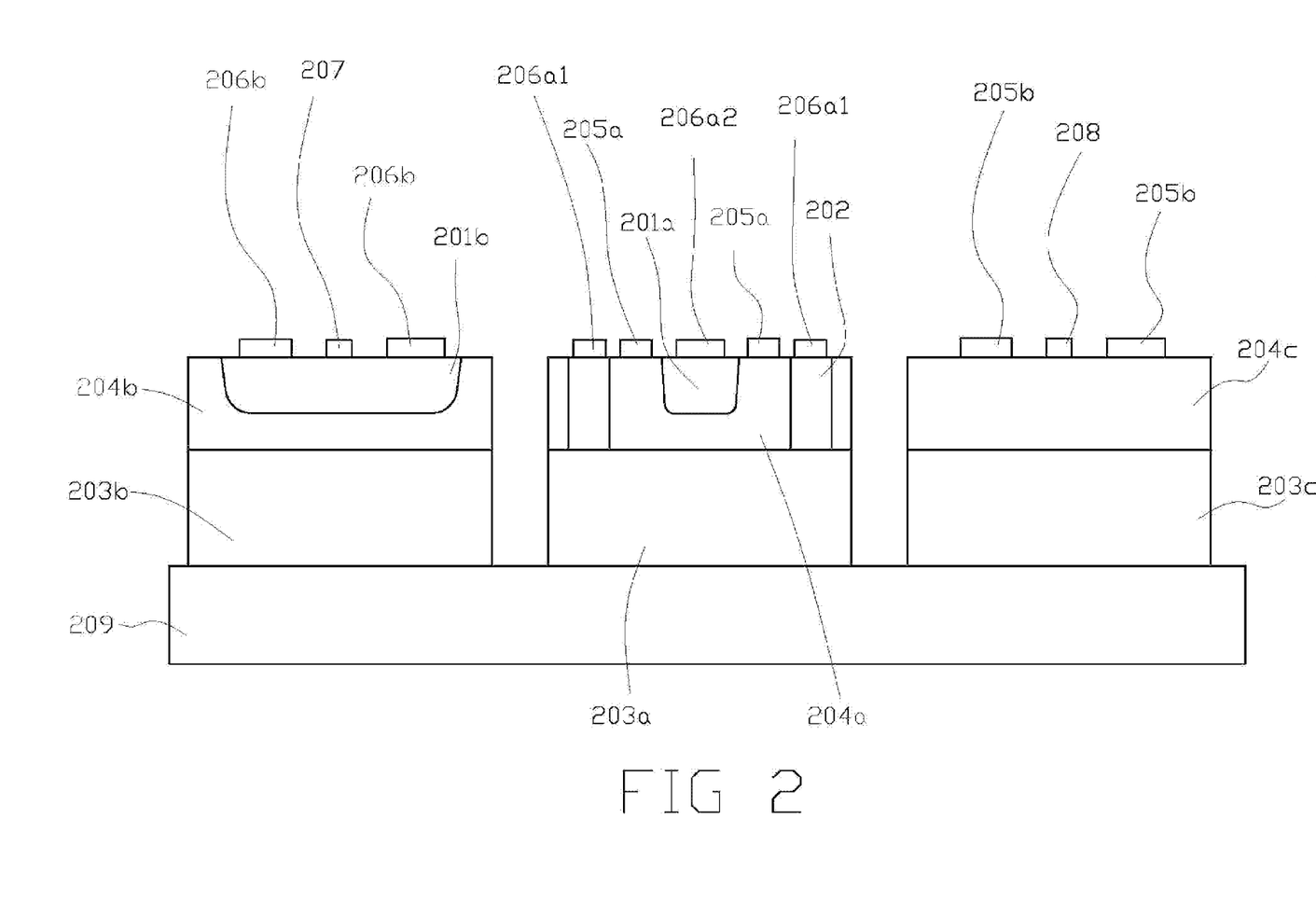
FIG. 2 is a cross sectional view of a planar combined structure of a GaN BJT and a n-type and p-type metal semiconductor field effect transistor (MESFET)

In accordance with the present invention, an n-type channel region 201b of an n-type metal semiconductor field effect transistor (MESFET) is formed concurrently when an emitter well region 201a of a gallium nitride (GaN) bipolar junction transistor (BJT) is formed by means of a particular mask design. And the BJT and the n-type MESFET are intended to be formed on the same horizontal base. As shown in FIG. 2, a planar combined structure of this invention comprises a substrate 209 for crystal growth, an emitter well region 201a, an n-type channel region 201b of an n-type MESFET and a collector contact well region 202 of the GaN BJT. A collector layer 203a serves as a substrate layer 203b of the n-type MESFET and also as a buried layer 203c of the p-type MESFET. A base layer 204a of the GaN BJT serves as a buried layer 204b of the n-type MESFET and also as a channel layer 204c of the p-type MESFET. A base metal electrode 205a serves as a source metal electrode and a drain metal electrode 205b of the p-type MESFET. An emitter metal electrode 206a2 and a collector metal electrode 206a1 of the BJT are used concurrently as a source metal electrode and a drain metal electrode 206b of the n-type MESFET, respectively. A gate Schottky metal electrode 207 of the n-type MESFET and a gate Schottky metal electrode 208 of the p-type MESFET are formed separately. In the planar combined structure, the p-type MESFET is also intended to be formed on the same horizontal base with respect to the GaN BJT and the n-type MESFET.

Specifically, the planar combined structure of the gallium nitride (GaN) bipolar junction transistor (BJT) and the n-type and p-type metal semiconductor field effect transistors (MESFETs) of the present invention comprises the following components: the substrate 209 for crystal growth, the GaN BJT, n-type MESFET formed on the substrate 209 for crystal growth and the p-type MESFET formed on the substrate 209 for crystal growth.

The GaN BJT comprises a low doped n-type collector layer 203a formed on the substrate 209 for crystal growth; a high doped p-type base layer 204a formed on the low doped collector layer 203a; a high doped n-type emitter well region 201a formed within the high doped p-type based layer 204a; a high doped n-type collector contact well region 202 formed within the high doped p-type base layer 204a; and an emitter metal electrode 206a2, a base metal electrode 205a and a collector metal electrode 206a1 formed on the emitter well region 201a, the base layer 204a and the collector contact well region 202, respectively.

The n-type MESFET formed on the substrate 209 for crystal growth comprises a low doped n-type substrate layer 203b formed on the substrate 209 for crystal growth; a high doped p-type buried layer 204b formed on the low doped substrate layer 203b; a high doped n-type channel region 201b formed with the high doped p-type buried layer 204b; and a gate Schottky metal electrode 207, a drain metal electrode 206b and a source metal 206b formed on the high doped n-type channel region 210b.

The p-type MESFET formed on the substrate 209 for crystal growth layer comprises a low doped n-type buried layer 203c formed on the substrate 209; a high doped p-type channel layer 204c formed on the low doped n-type buried layer 203c; and a gate Schottky metal electrode 208, a drain metal electrode 205b and a source metal electrode 205b formed on the high doped p-type channel layer 204c.

In the planar combined structure, the n-type layers 203 and p-type layer 204 are currently formed by a molecular beam epitaxy (MBE) method or a metal-organic vapor phase epitaxy (MOVPE) method, as shown in FIG. 3.

In the planar combined structure, the substrate 209 for crystal growth is made of one selected from the group consisting of $Al_2O_3$, SiC, ZnO, Si, GaN, $Al_xGa_{1-x}N$, $In_xGa_{1-x}N$ and $In_xAl_yGa_{1-x-y}N$, wherein $0 \leq x \leq 1$ and $0 \leq y \leq 1$.

In the planar combined structure, the substrate 209 is made of one selected from the group consisting of SiC, ZnO, GaN, $Al_xGa_{1-x}N$, $In_xGa_{1-x}N$ and $In_xAl_yGa_{1-x-y}N$ wherein $0 \leq x \leq 1$ and $0 \leq y \leq 1$.

In the planar combined structure, each of the GaN BJT and n-type and p-type MESFETs is made of one selected from the group consisting of SiC, ZnO, GaN, $Al_xGa_{1-x}N$, $In_xGa_{1-x}N$ and $In_xAl_yGa_{1-x-y}N$, wherein $0 \leq x \leq 1$ and $0 \leq y \leq 1$.

In the planar combined structure, each of the emitter, the collector contact well region 202 and the channel region 204c is formed by the ion implantation method or the impurity diffusion method.

In the planar combined structure, each of the emitter metal electrode 206a2, the base metal electrode 205a, the collector metal electrode 206a1, the gate Schottky metal electrodes 207, 208, the source metal electrode and drain metal electrode 205b is made of one selected from the group consisting of Au, Pt/Ti/Pt/Au, Ti/Al/Ti/Au, Ti/Au, Cr/Au, Pd/Au, Ti/Pd/Au, Pd/Ti/Au, Cr, Pt/Au, Ni/Au, Ta/Ti, Ti/Pt/Au, Ti/Cr/Au and Pt/Ru.

In the planar combined structure, the GaN BJT and n-type and p-type MESFETs are formed on the substrate 209 concurrently.

Figure 3A:
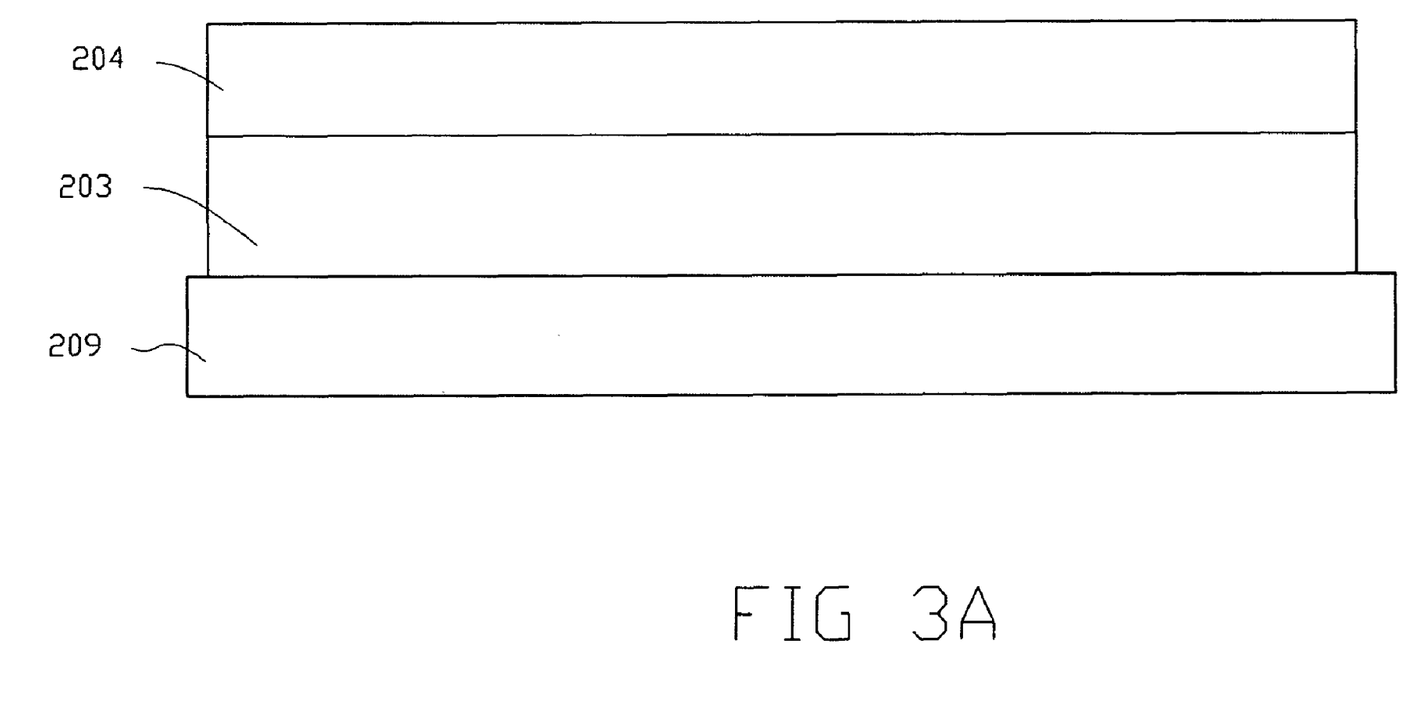
Figure 3B:
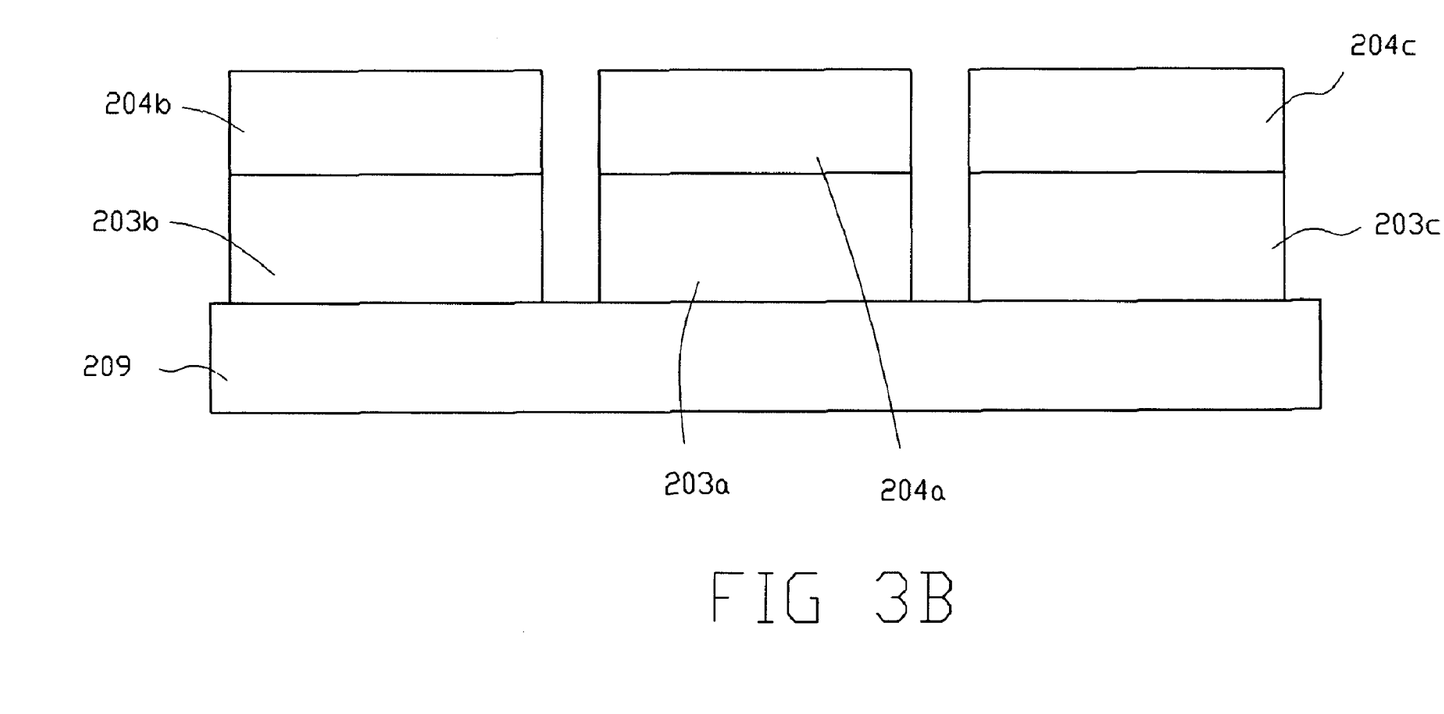
Figure 3C:
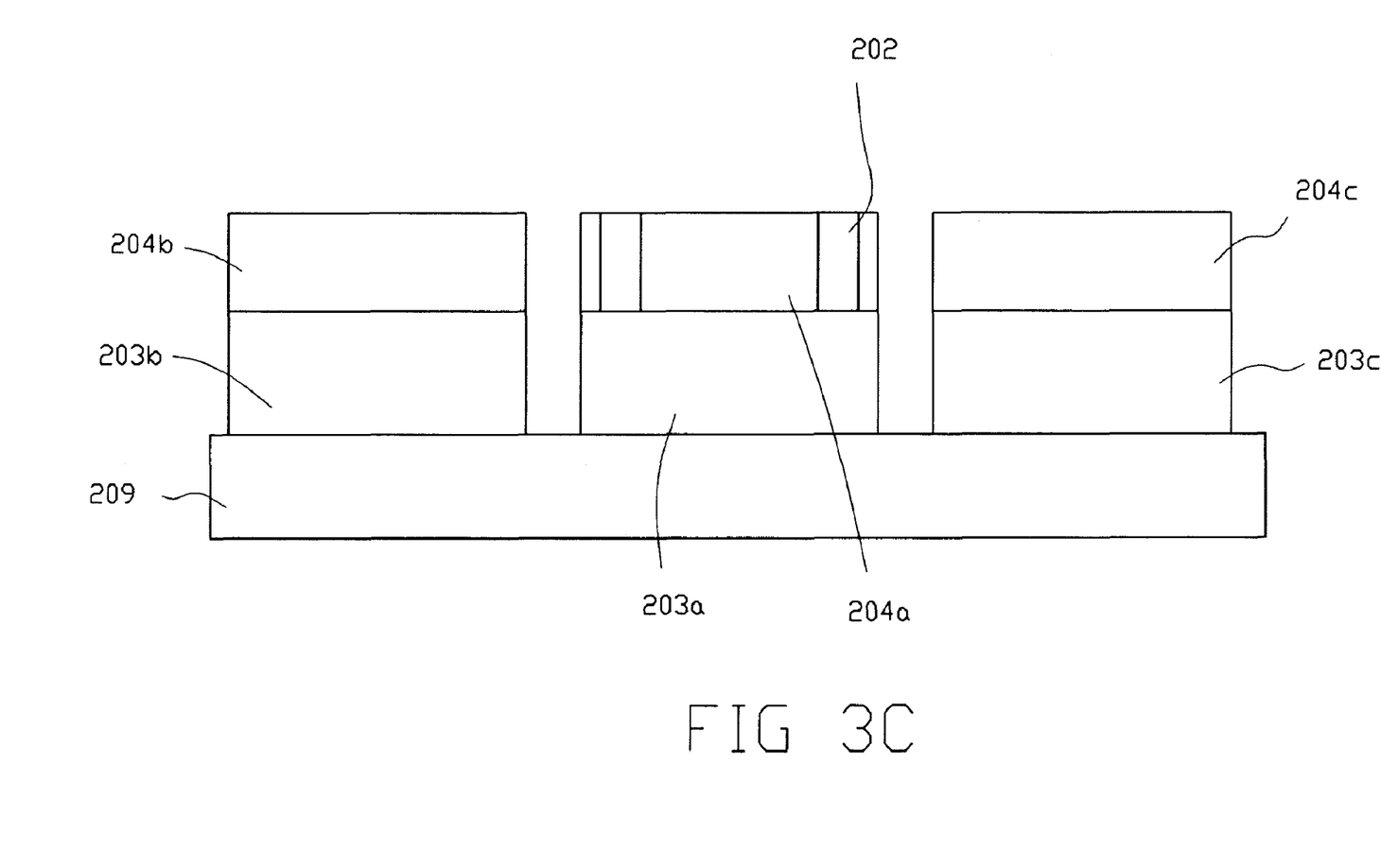
Figure 3D:
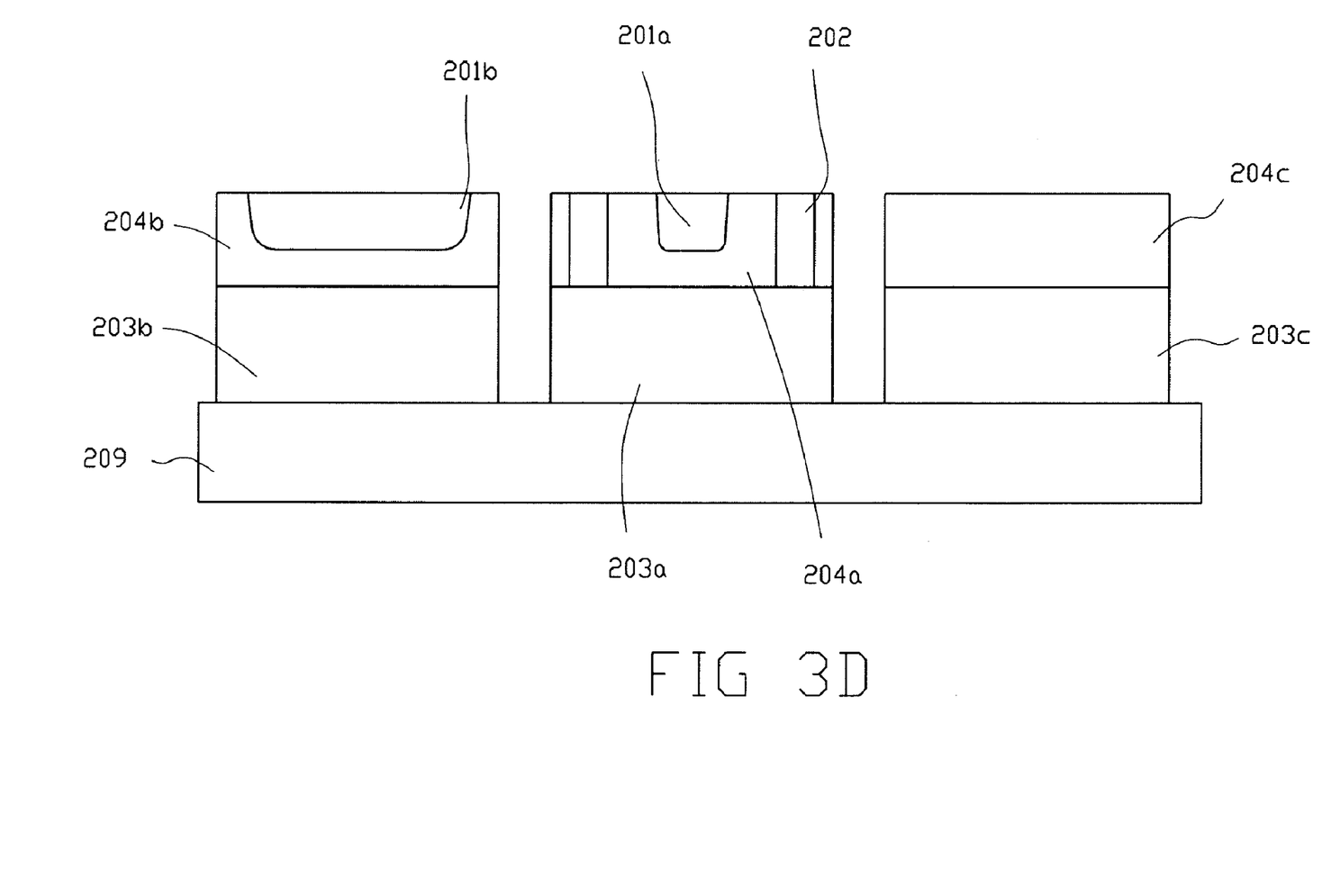
Figure 3E:
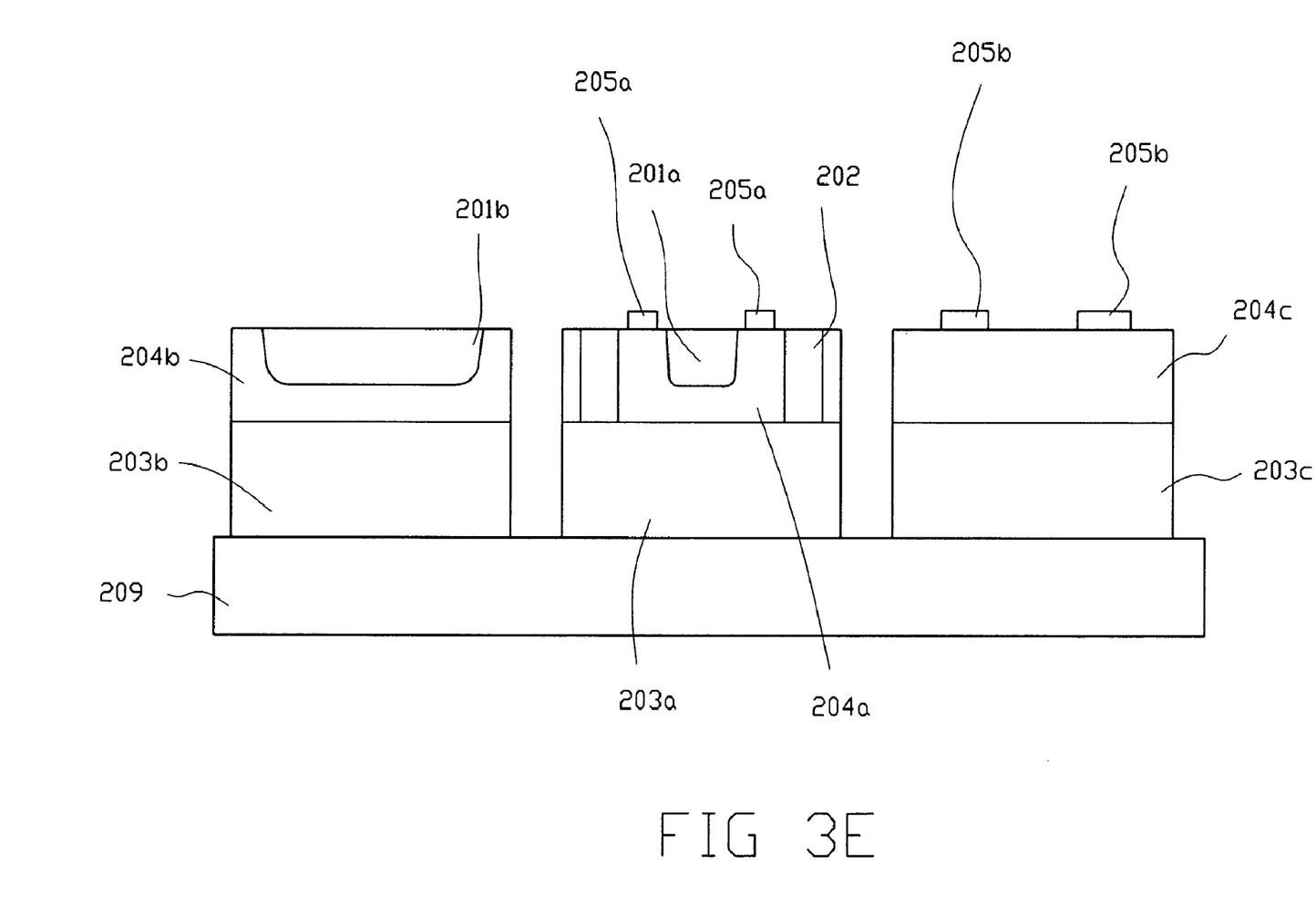
Figure 3F:
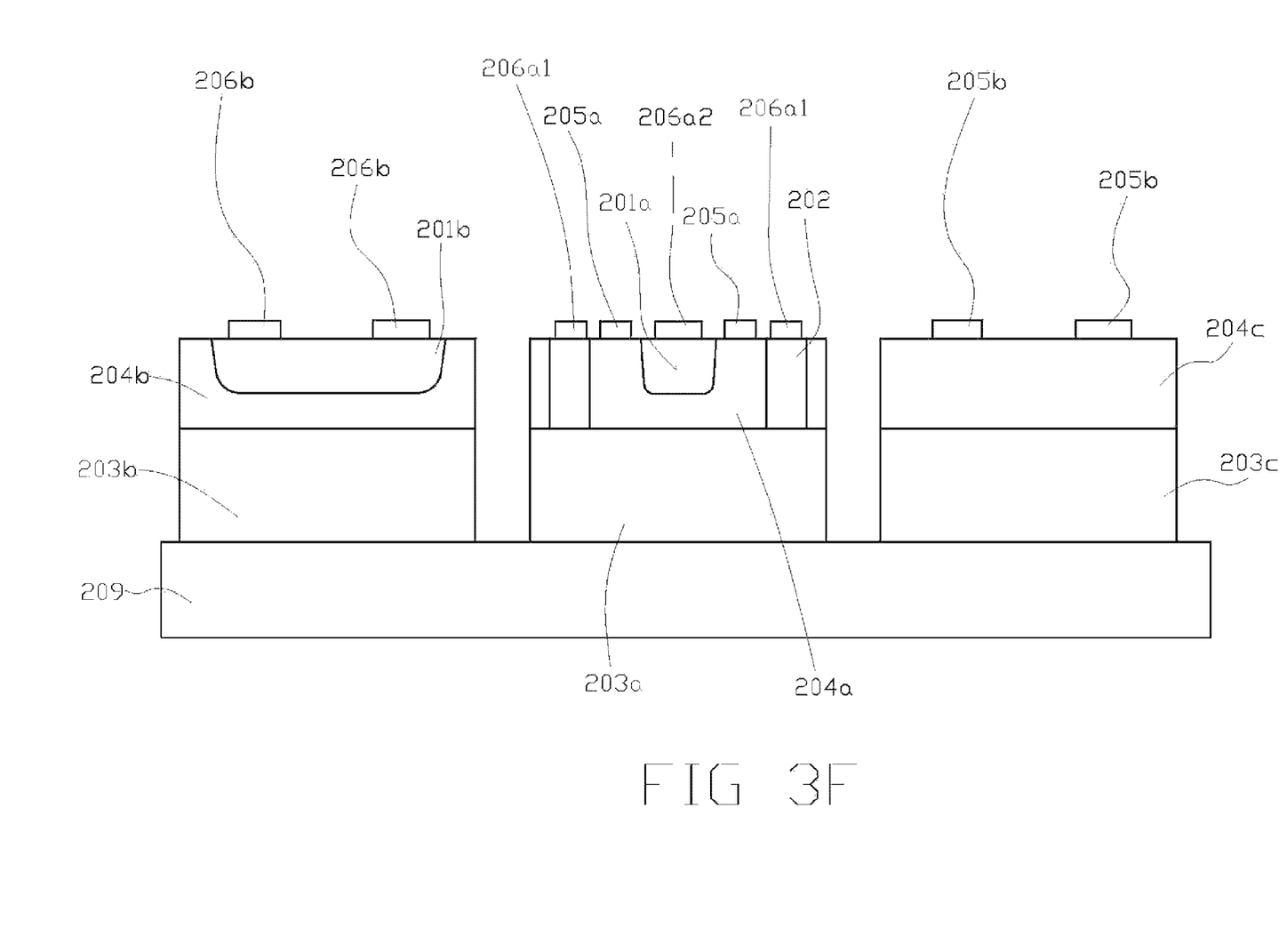
Figure 3G:
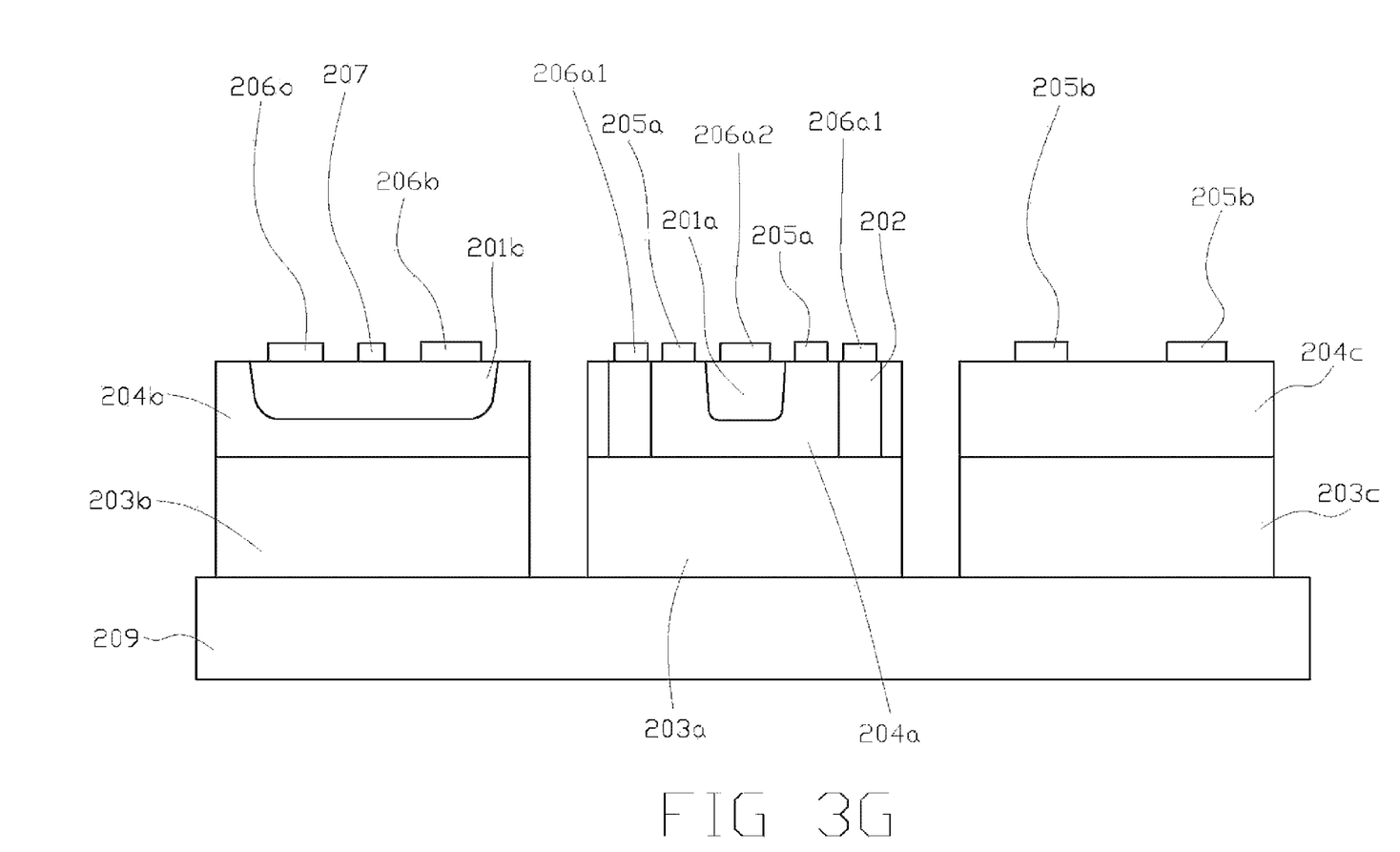
Figure 3H:
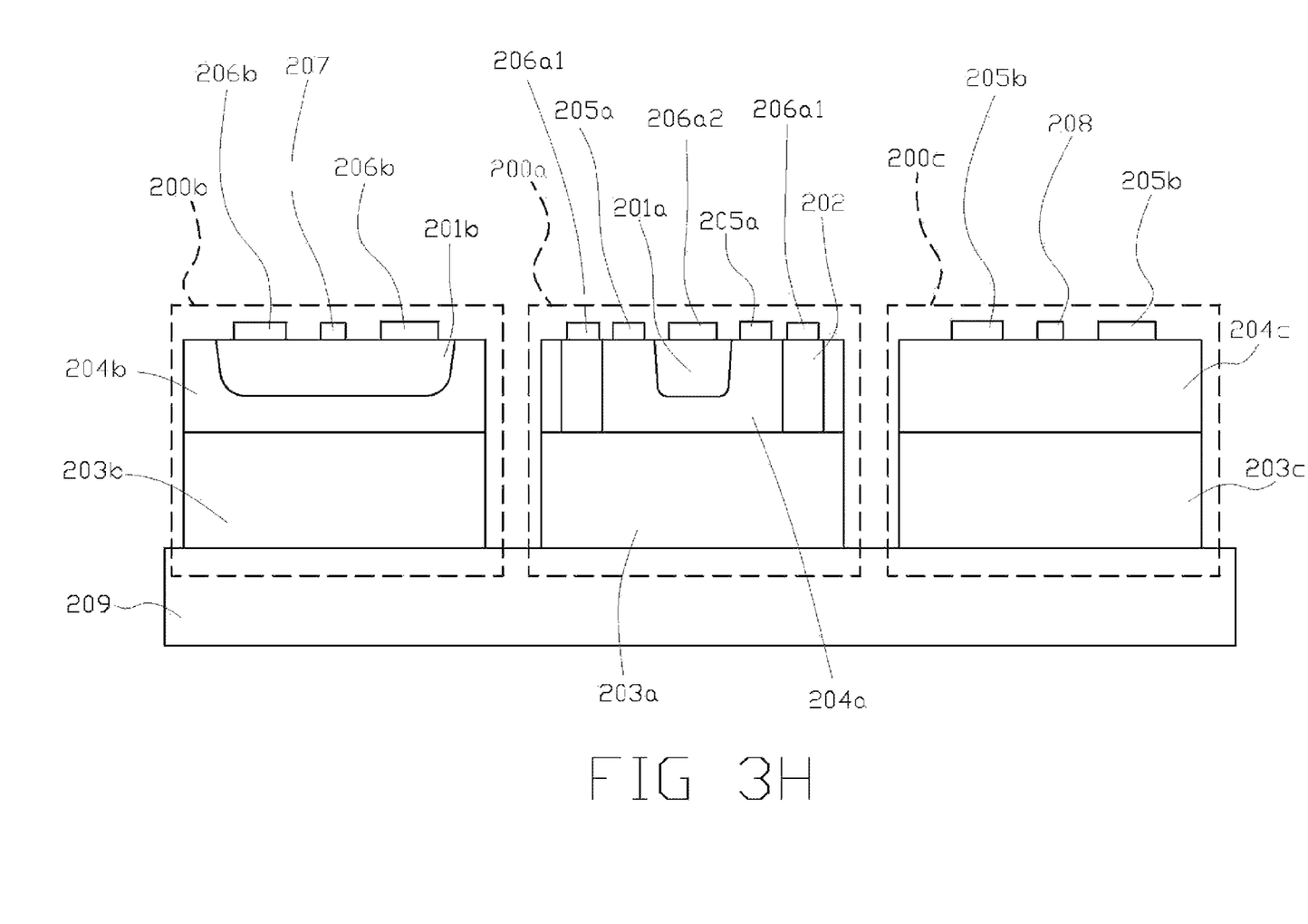
Figure 4:
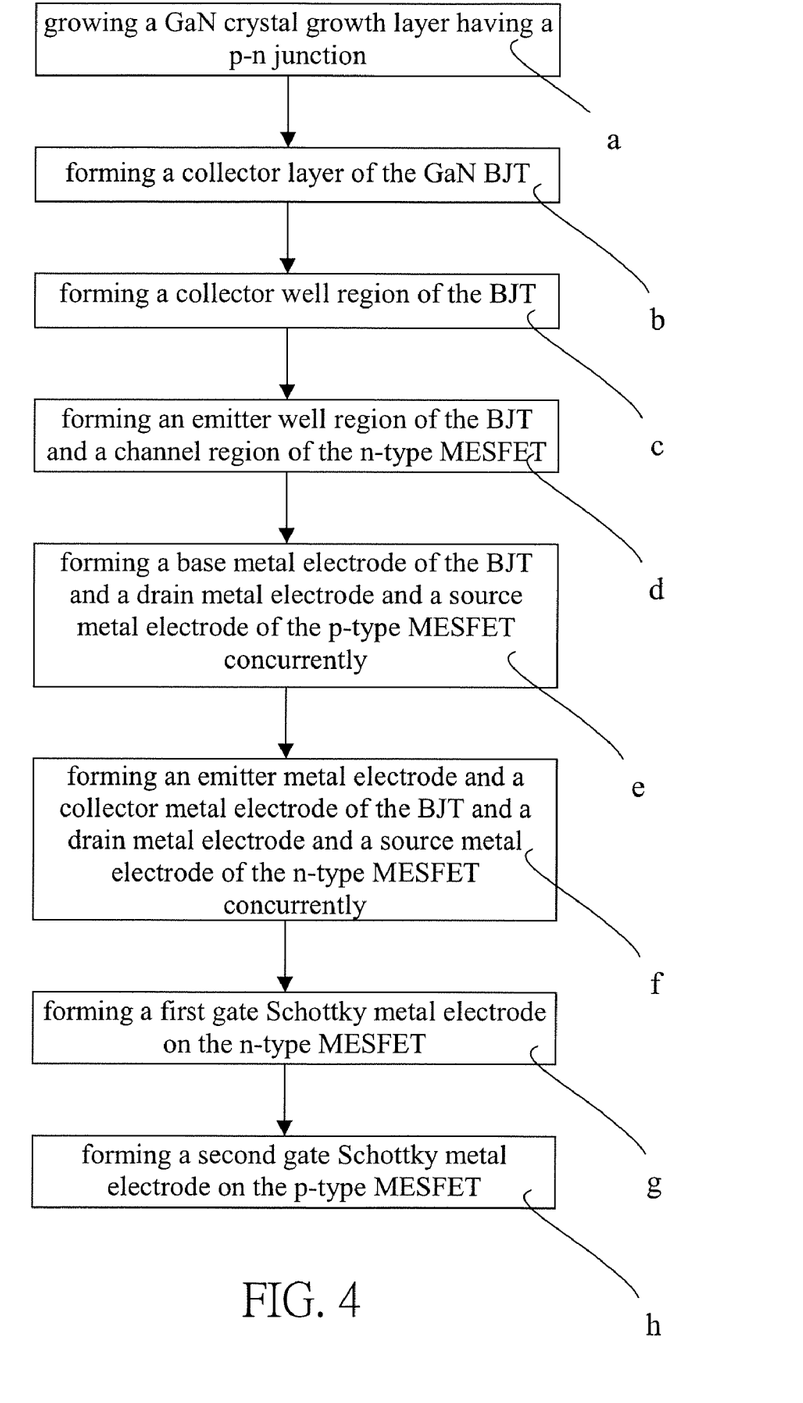
FIG. 4 is a flowchart for illustrating the manufacturing process corresponding to the structures shown in FIG. 3A through FIG. 3H.

Herein below, a method for forming a planar combined structure of the gallium nitride (GaN) bipolar junction transistor (BJT) and n-type and p-type metal semiconductor field effect transistors (MESFETs) according to the present invention will be described with reference FIG. 3a through FIG. 3h and FIG. 4, in which FIG. 3A through 3H are cross sectional views of the planar combined structure shown in FIG. 2 formed at stages of a manufacturing process thereof for illustration of respective steps of the manufacturing process, and FIG. 4 is a flowchart for illustrating the manufacturing process corresponding to the structures shown in FIG. 3A through FIG. 3H. The method comprises the following steps. At first, growing a GaN crystal growth layer having a p-n junction by forming a GaN substrate for crystal growth having an n-type layer and a p-type layer (Step a). The GaN crystal growth layer comprises a substrate 209 for crystal growth, an n-type layer 203 and a p-type layer 204. The n-type layer 203 comprises a collector layer 203a, a substrate layer 203b of the n-type MESFET and a buried layer 203c of the p-type MESFET as shown in FIG. 3b. The p-type layer 204 comprises a base layer 204a of the GaN BJT, a buried layer 204b of the n-type MESFET and a channel layer 204c of the p-type MESFET.

Next, forming a collector layer 203a of the GaN BJT, a substrate layer 203b of an n-type MESFET, a buried layer 203c of a p-type MESFET, a base layer 204a of the GaN BJT, a buried layer 204b of the n-type MESFET and a channel layer 204c of the p-type MESFET on the crystal growth substrate 209 (Step b).

Then, forming a collector contact well region 202 of the BJT by using the ion implantation or impurity diffusion method (Step c). At the same time, forming an emitter well region 201a of the BJT and a channel region 201b of the n-type MESFET concurrently by also using the ion implantation or impurity diffusion method (Step d). Between Steps c and d, a step of activating the emitter contact well 201a of the BJT and the channel region 201b of the n-type MESFET concurrently by providing a high temperature may be provided. Thereafter, forming a base metal electrode 205a of the BJT and a drain metal electrode and a source metal electrode 205b of the p-type MESFET concurrently (Step e).

Then, forming an emitter metal electrode and a collector metal electrode 206a1 of the BJT and a drain metal electrode and a source metal electrode 206b of the n-type MESFET concurrently (Step f).

Then, forming a first gate Schottky metal electrode 207 on the n-type MESFET (Step g).

Finally, forming a second gate Schottky metal electrode 208 on the p-type MESFET (Step h).

As such, the formation of the planar combined structure of the BJT and n-type and p-type MESFETs is completed.

The invention claimed is:

1. A method for forming a planar combined structure of a gallium nitride (GaN) bipolar junction transistor (BJT) and n-type and p-type metal semiconductor field effect transistors (MESFETs), comprising the steps of:
    (s1) growing a GaN crystal growth layer having a p-n junction by forming a GaN substrate for crystal growth having an n-type layer and a p-type layer;
    (s2) forming a collector layer of the GaN BJT, a substrate layer of an n-type MESFET, a buried layer of a p-type MESFET, a base layer of the GaN BJT, a buried layer of the n-type MESFET and a channel layer of the p-type MESFET;
    (s3) forming a collector well region of the BJT, and an emitter well region of the BJT and a channel region of the n-type MESFET concurrently by using one of an ion implantation method and an impurity diffusion method;
    (s4) forming a base metal electrode of the BJT and a drain metal electrode and a source metal electrode of the p-type MESFET concurrently;
    (s5) forming an emitter metal electrode and a collector metal electrode of the BJT and a drain metal electrode and a source metal electrode of the n-type MESFET concurrently;
    (s6) forming a first gate Schottky metal electrode on the n-type MESFET;
    (s7) forming a second gate Schottky metal electrode on the p-type MESFET; and
    wherein steps s1-s7 are conducted in ordered sequence.

2. The method as claimed in claim 1, further comprising a step, between the steps (s3) and (s4), of activating the collector contact well of the BJT and the emitter well region/channel region of the n-type MESFET concurrently or separately by providing a high temperature.

* * * * *